United States Patent
Gilleo (10) Patent No.: US 6,838,372 B2
(45) Date of Patent: Jan. 4, 2005

(54) VIA INTERCONNECT FORMING PROCESS AND ELECTRONIC COMPONENT PRODUCT THEREOF

(75) Inventor: Kenneth B. Gilleo, Cranston, RI (US)

(73) Assignee: Cookson Electronics, Inc., Foxborough, MA (US)

(*) Notice: Subject to any disclaimer, the term of this patent is extended or adjusted under 35 U.S.C. 154(b) by 42 days.

(21) Appl. No.: 10/254,703

(22) Filed: Sep. 25, 2002

(65) Prior Publication Data

US 2004/0056345 A1 Mar. 25, 2004

(51) Int. Cl.[7] .......................................... H01L 21/4763
(52) U.S. Cl. ...................................... 438/629; 438/640
(58) Field of Search ................................ 438/629, 637, 438/638, 639, 640, 668, 672, 675; 257/774

(56) References Cited

U.S. PATENT DOCUMENTS

| | | | |
|---|---|---|---|
| 5,250,388 A | * 10/1993 | Schoch et al. | ............. 430/269 |
| 5,523,185 A | 6/1996 | Goto | |
| 5,637,176 A | 6/1997 | Gilleo et al. | |
| 6,011,629 A | 1/2000 | Ootake et al. | |
| 6,057,224 A | * 5/2000 | Bothra et al. | ............. 438/619 |
| 6,063,476 A | 5/2000 | Kinoshita | |
| 6,133,635 A | 10/2000 | Bothra et al. | |
| 6,221,779 B1 | 4/2001 | Dennison et al. | |
| 6,228,678 B1 | 5/2001 | Gilleo et al. | |
| 6,228,681 B1 | 5/2001 | Gilleo et al. | |
| 6,245,662 B1 | 6/2001 | Naik et al. | |
| 6,465,084 B1 | * 10/2002 | Curcio et al. | ............. 428/209 |
| 6,465,358 B1 | * 10/2002 | Nashner et al. | ............. 438/700 |
| 6,503,827 B1 | * 1/2003 | Bombardier et al. | ........ 438/631 |
| 6,555,467 B2 | * 4/2003 | Hsu et al. | .................... 438/633 |
| 6,605,534 B1 | * 8/2003 | Chung et al. | ............. 438/674 |
| 6,645,607 B2 | * 11/2003 | Curcio et al. | ............. 428/209 |
| 6,664,023 B2 | * 12/2003 | MacDowell et al. | ..... 430/270.1 |
| 2003/0134505 A1 | * 7/2003 | Dalton et al. | ............. 438/637 |

OTHER PUBLICATIONS

Khol et al.; "Air–Gaps for Electrical Interconnects"; pp. 49–51; Electrochemical and Solid–State Letters, 1(1) 49–51 (1998); May 27, 1998.*

* cited by examiner

Primary Examiner—George Fourson
Assistant Examiner—F. L. Toledo
(74) Attorney, Agent, or Firm—Senniger Powers (57) ABSTRACT

A process for masking an electronic component substrate involving application of a temporary mask material to the substrate to form a removably adhered temporary mask over the surface. Exemplary mask materials include polymer films and aqueous hardenable liquid coatings. An electronic component substrate having a temporary mask for masking the substrate surface from interconnect fill material.

67 Claims, 7 Drawing Sheets

VIA INTERCONNECT FORMING PROCESS AND ELECTRONIC COMPONENT PRODUCT THEREOF

BACKGROUND OF THE INVENTION

The present invention relates to the formation and filling of interconnects within electronic components such as printed circuit boards and integrated circuits.

With changes in sophistication of electronic equipment over the years, manufacturers of electronic component packages have produced higher density circuits in smaller packages. High interconnect density on electronic component packages is provided by utilizing multi-layer circuits separated by a dielectric material. The demand for manufacturing semiconductor IC devices such as computer chips with high circuit speed, high packing density, and low power dissipation requires the downward scaling of feature sizes in ultra-large-scale integration (ULSI) and very-large-scale integration (VLSI) structures. This demand presents an acute challenge to retain and advance the integrity of the prior-generation electronic component packages while dramatically increasing the processing capability of the circuitry.

In general, electronic component packages are manufactured using conductive traces on the surface, or X-Y plane, of the electrical circuit's substrate to connect discrete electronic devices. Distinct layers of the package are vertically connected by through-hole interconnects, or vias. Conductive vias are traditionally created by drilling though a stack of circuit substrate layers, then plating the wall of the via with an electrically conductive material. Such multi-layered circuits may contain as many as 100–200 vias per square inch (15–30 per square centimeter).

In the continuing effort to shrink the size of electronic component packages and increase the density of electronic components in a given package, microvias having a diameter of less than about 1 mil (25 microns) have been created by laser machining, plasma etching, or photolithography.

As an alternative to plating of metal into interconnects, monomer paste is often used to fill interconnects. After interconnects are formed, a pattern is laid over the workpiece and a screen-printing or stenciling process forces filler paste into the interconnects. A stencil or other masking device is required to prevent the paste from contacting the substrate surface other than the interconnects, because filler material is difficult to remove from the substrate surface and can compromise the electrical properties thereof. These processes require fine dimensional alignment of holes in a stencil with the interconnects, with is increasingly difficult as the industry moves toward smaller and smaller interconnects, or microvias. Moreover, there can be difficulties ensuring sufficient fill characteristics of the interconnects. These concerns are compounded as the workpiece increases in size or in interconnect density by the tendency of the workpiece's dimensions to change, even slightly, during processing.

Once an interconnect is filled with the paste, the workpiece is subjected to a thermal treatment, which cures the paste by initiating a polymerization process. The paste undergoes appreciable shrinkage during the polymerization process, resulting in depressions where the cured interconnect fill material shrinks and is no longer coplanar with the substrate surface. Such depressions may trap processing materials in the interconnect such as, for example, flux or cleaning chemicals, compromising the electrical integrity of the electronic component package.

SUMMARY OF THE INVENTION

Among the several objects of this invention, therefore, is an electronic component wherein cured interconnects are coplanar with the surface of component substrate; a process for forming and filling interconnects having improved fill characteristics; a process for forming and filling interconnects which does not require use of a preformed stencil and precise alignment thereof with interconnects in the substrate; and efficiently producing high-density vertical electronic interconnects of superior quality to the quality achieved by present methods.

Briefly, therefore, the invention is directed to a process for masking an electronic component substrate having an upper surface and a lower surface from contact with filler material employed in an interconnect filling procedure. The process steps include applying a temporary mask material to at least one of the upper and lower surfaces to form a removably adhered temporary mask over the surface to which the temporary mask material is applied, wherein the temporary mask material is selected from among polymer films and aqueous hardenable liquid coatings.

The invention is also directed to a process for filling an interconnect between an upper surface and a lower surface of an electronic component substrate; this involves applying a temporary mask material to at least one of the upper and lower surfaces to form a removably adhered temporary mask over the surface to which the temporary mask material is applied, forming a hole in the temporary mask at an opening of the interconnect to the substrate surface, and filling the interconnect with a filler material by forcing the filler material through the hole in the temporary mask into the interconnect.

In another aspect the invention is a process for forming and filling an interconnect between an upper surface and a lower surface of an electronic component substrate. This involves applying a temporary mask material to at least one of the upper and lower surfaces to form a removably adhered temporary mask over the surface to which the temporary mask material is applied, forming a continuous through-hole extending through the mask and through the substrate, the continuous through-hole comprising a hole in the temporary mask and the interconnect through the substrate, and filling the interconnect with a filler material by forcing the filler material through the hole in the temporary mask and into the interconnect.

The invention further includes a process for filling an interconnect between an upper surface and a lower surface of an electronic component substrate which includes applying a temporary mask material to each of the upper and lower surfaces to form a removably adhered temporary mask; forming a continuous through-hole extending through the mask and through the substrate, the continuous through-hole comprising a hole in the temporary mask and a hole through the substrate constituting the interconnect; and filling the interconnect with a filler material by forcing the filler material through the hole in the temporary mask and into the interconnect hole.

The invention is also directed to an electronic component substrate having a temporary mask for masking at least one of the upper and lower surfaces of the substrate from contact with interconnect fill material, the temporary mask being removably adhered to at least one of the surfaces. This temporary mask comprises temporary mask material selected from among polymer films and aqueous hardenable liquid coatings.

And the invention further encompasses an electronic component substrate having a temporary mask comprising a temporary mask material removably adhered to at least one of the upper and lower substrate surfaces, and an interconnect hole through the substrate formed co-axially and contemporaneously with a hole in the temporary mask.

Other objects and features of the invention will be in part apparent, and in part described hereafter.

DETAILED DESCRIPTION OF THE INVENTION

In accordance with this invention, interconnects, including but not limited to microvias, are formed in a substrate or group of substrates and filled so as to provide interconnects between substrate surfaces, which interconnects terminate at the substrate surface coplanar with the substrate surfaces. To generally describe the overall process, a temporary mask is applied to the substrate surface, interconnects are formed through the mask and through the substrate, the interconnects are filled, and the temporary mask is removed, leaving a substrate with filled interconnects.

In one embodiment at least some of the interconnects are electrically conductive interconnects, and a conductive circuit is prepared by any known method on the surfaces of a dielectric or nonconductive board substrate. For example, photolithography and etching can be used to create a circuit pattern on an IC chip. In another embodiment, printed circuit boards are plated with a conductive material, which is then selectively etched to create the desired circuit pattern. In any embodiment, additional layers may be produced using a similar circuit etching procedure and combined using the stack-up method. The manner of creating the circuit pattern is not critical to this invention.

Figure 1:
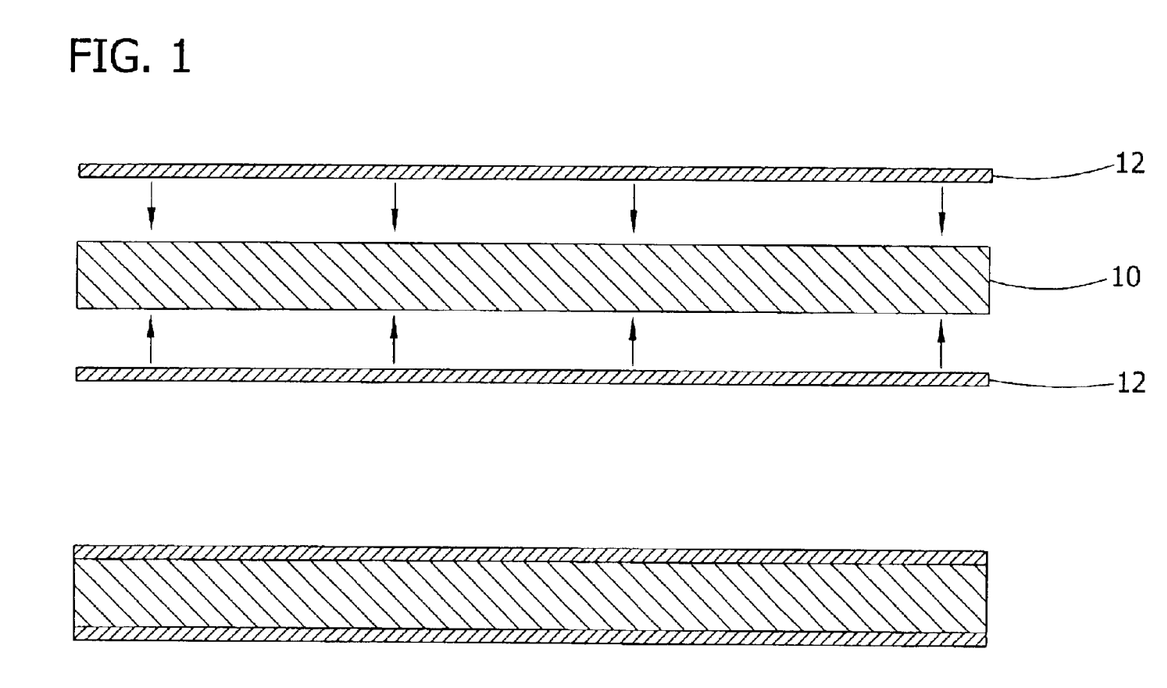
FIG. 1 schematically shows application of temporary masks to an electronic component substrate presented in cross section.

After the circuit etching or plate-up process on the workpiece substrate is completed, a thin coating or a plastic film 12 is applied to the top and bottom of the workpiece 10 as shown in FIG. 1. This coating or film acts as a temporary mask that will be removed at a later time in the processing.

In one embodiment, the temporary mask is a tightly clinging polymer film. The polymer film is selected from among polymers which temporarily integrally adhere to the substrate, and which is readily removable by mechanically peeling away the film. The cling mask can be removed manually, or automatically with a tacky roller or vacuum device. The vacuum device can be a cylinder with small holes at the surface that communicate with a vacuum source. Alternatively, a vacuum plate can be used that makes contact with one edge of the film and then moves laterally to peel away the film. Examples of such polymers include polyvinyl chloride, polyethylene, polypropylene and polyesters coated with low-tack pressure-sensitive adhesives. In one preferred embodiment, the polymer film is a polyvinyl chloride that is made slightly tacky by use of a high level of plasticizer and commonly referred to as cling masks or cling wrap film. Alternatively, films can be coated with a low-tack pressure sensitive adhesive such as acrylic-based materials, on one side to bond the film to the substrate surface. This type of temporary mask is applied by hand, but an automated roll laminator is preferred.

In another embodiment, the temporary mask is a liquid coating, such as, for example, a removable coating such as a resist coating that is screen-printed onto the workpiece. Examples of such coatings include photosensitive urethane acrylates with solubilizing groups such as carboxylic acid groups, polymethyl methacrylates, photo-crosslinkable monomers such as esters of polyalcohols, and polyvinyl cinnamate. This type of temporary mask is applied by any of a variety of techniques, include immersion, spraying, and roller coating. If an especially thin temporary mask is desired, it is applied by vapor deposition, for example, employing coating equipment available from Cookson Electronics Equipment Group, Specialty Coatings Systems (Indianapolis, Ind.) distributed under the designation SCS 2060.

The masks are cured by heat, ultraviolet radiation, or in situ polymerization.

The thickness of the temporary mask is determined by the particular application and, primarily, by the rate of shrinkage of the filler material during polymerization. In any embodiment, if the shrinkage rate of the filler material in an interconnect of known diameter is known to equate to a distance 2x, then the temporary mask on each side of the substrate must be of a thickness X. In one embodiment the shrinkage of the filler material upon curing equates to a distance of about 2 mils, so a mask having a thickness of about 1 mil is applied to each side of the substrate.

Figure 2:
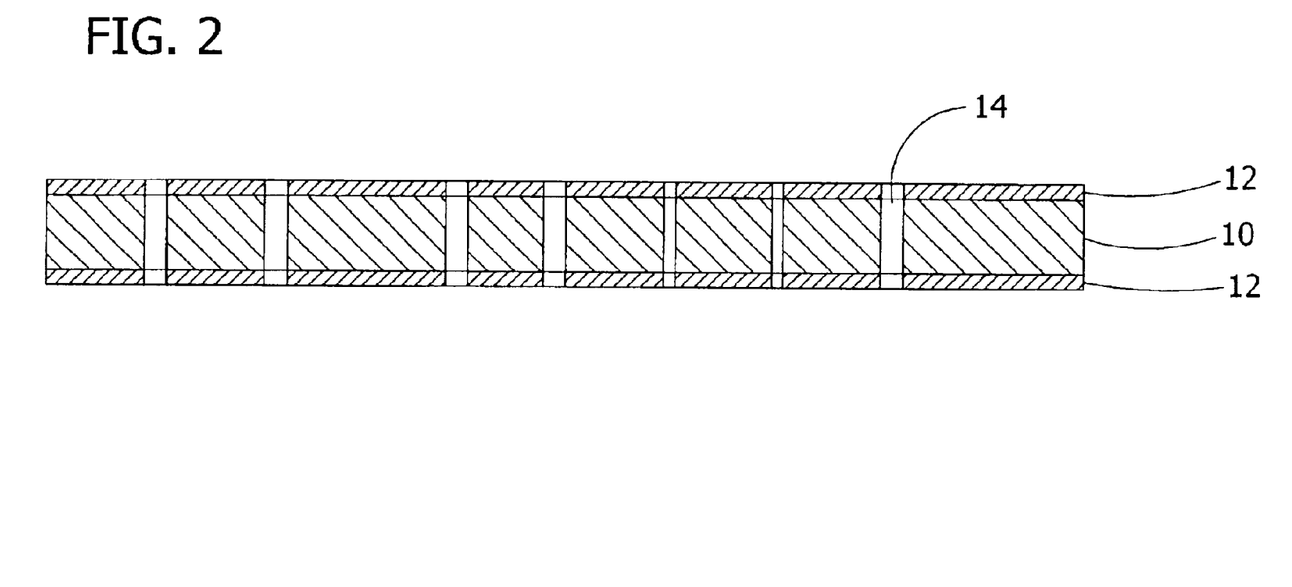
FIG. 2 schematically shows a profile of an electronic component substrate presented in cross section with temporary masks thereon after formation of interconnects.

After the temporary masks are applied to the workpiece, interconnects 14 are formed through the temporary masks and through the substrate as illustrated in FIG. 2. In the currently preferred embodiment, the interconnects are formed by laser-drilling. They are alternatively formed by other processes such as mechanical drilling, plasma etching, or the like.

If plastic films are used as the temporary masks, a light absorber or dye appropriate for the laser wavelength being used may be used to facilitate the laser machining of the mask. Many polymer masks are transparent to commercial laser wavelengths. But unless energy is absorbed by the mask that leads to thermal decomposition, or photoablation, the mask will remain unchanged and the necessary opening will not form. It is therefore necessary to use a laser wavelength that is absorbed, but more preferable to add an absorber that permits the circuit board machine laser to be used.

The function of the masks is realized during subsequent filling of the interconnects with filler material. In particular, the masks—both the temporary masks of the invention as well as permanent masks or stencils used in prior art processes—have holes intended to be directly aligned and registered with interconnects, and serve to guide the subsequently applied flowable filler material into the interconnects, and to prevent contact of the filler material with the surface of the substrate by masking the surface therefrom. If the filler material contacts the substrate surface, it must be meticulously removed as by chemical treatment and grinding so as not to compromise the electrically integrity of the surface. Contact of filler material with the substrate can ruin the substrate.

By applying the temporary masks prior to forming the interconnects, the temporary masks are an integral part of the workpiece, ensuring alignment of and exact registration of the interconnects and holes in the temporary masks. This is in contrast to the prior art processes, where the holes in the masks or stencils are formed in an operation separate from the formation of the interconnects. Because the holes in the prior art mask or stencil are formed by operations separate from the formation of the interconnects in the substrate, there is a risk that mask or stencil holes will not exactly align and register with the interconnects. This mismatch compromises the subsequent filling operation, as it can prevent or at least hinder guiding of the filler material into the interconnects, and it can allow the filler material to contact the substrate in the areas of mismatch. This problem of mismatch is addressed in the present invention by having the holes formed in the mask as part of the interconnect forming operation, involving contemporaneous and coaxial formation of the mask holes and interconnect holes, thereby assuring direct alignment and no mismatch. Moreover, this aspect of the invention eliminates the need to use permanent masks, stencils, or screens to protect the substrate surface during the interconnect filling stage.

Figure 3:
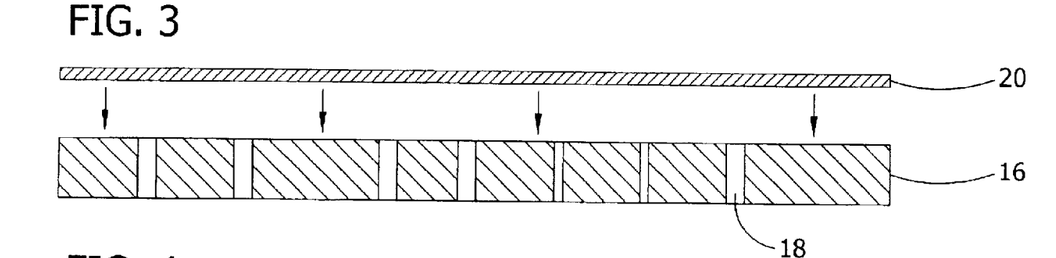
FIG. 3 schematically shows application of a temporary mask to an electronic component substrate presented in cross section having preformed interconnects.
Figure 4:
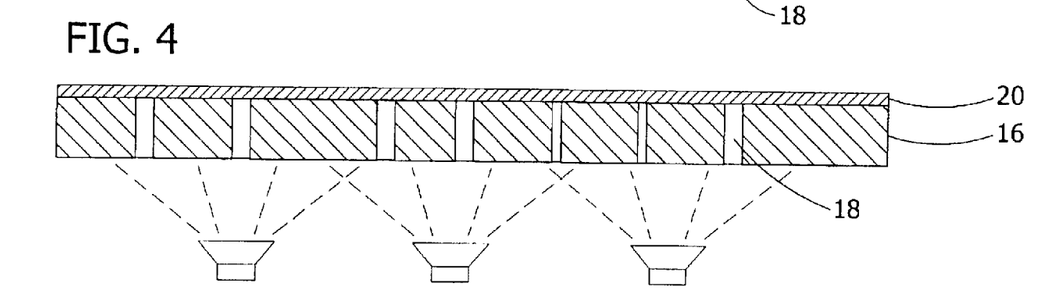
FIG. 4 schematically shows application of light to disintegrate portions of a temporary mask covering interconnects on an electronic component substrate presented in cross section.
Figure 5:
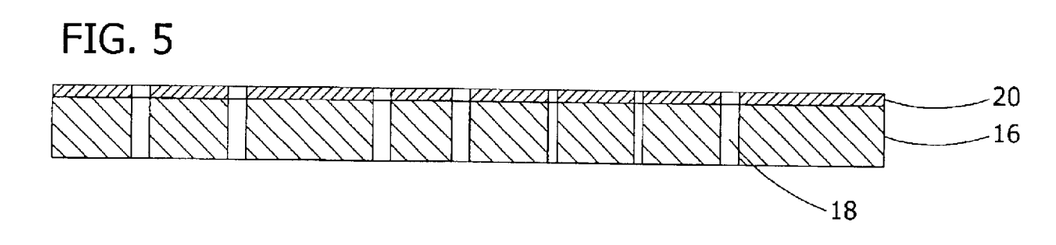
FIG. 5 schematically shows an electronic component substrate presented in cross section with a mask on one side thereof after completion of the light exposure and disintegration of FIG. 4.
Figure 6:
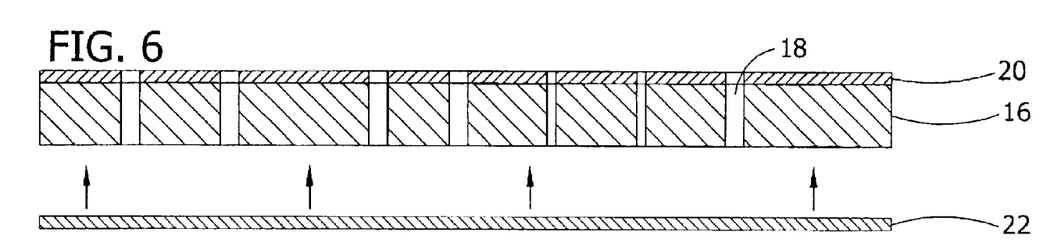
FIG. 6 schematically shows application of a temporary mask to the opposite surface of the electronic component substrate of FIGS. 3–5 presented in cross section.
Figure 7:
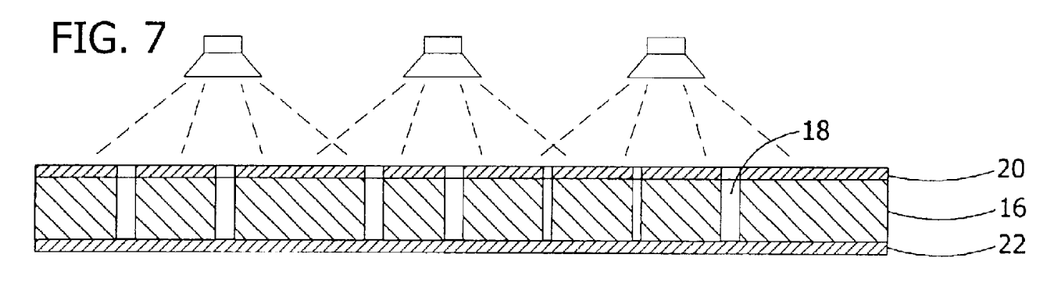
FIG. 7 schematically shows application of light to disintegrate portions of the temporary mask applied in FIG. 6 to an electronic component substrate presented in cross section.
Figure 8:
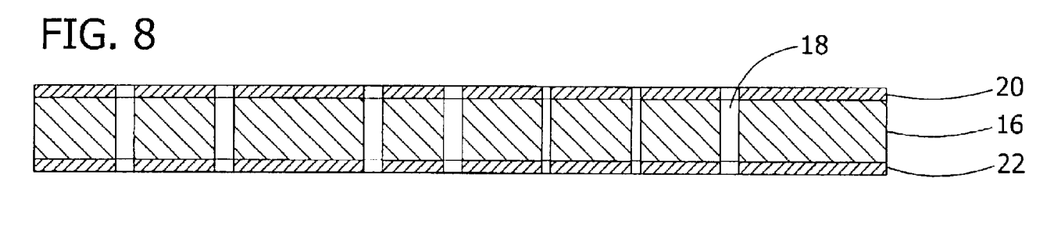
FIG. 8 schematically shows a profile of an electronic component substrate presented in cross section with temporary masks thereon prepared as in FIGS. 3–7.

In an alternative embodiment, the interconnects are formed prior to the application of the temporary mask, and the guide holes are formed in the mask after the mask is applied to the substrate. Due to the manner of forming the holes in the mask, precise alignment with the interconnect holes is ensured. In this embodiment, the temporary mask 20 such as a negative-active photosensitive material is applied to one of the two major surfaces of the substrate 16 with interconnects 18 already present as illustrated in FIG. 3. The opposite side of the workpiece of the workpiece is then exposed as illustrated in FIG. 4 to light of an appropriate wavelength required to degrade the photosensitive material. The light passes through the interconnects and degrades the portion of the temporary mask covering the interconnects to yield the masked substrate shown in FIG. 5. The workpiece is heated to stabilize the remaining photosensitive material, and another layer of negative-active photosensitive material 22 is applied to the unmasked side of the substrate as shown in FIG. 6. The side of the workpiece with the stabilized temporary mask is then exposed to light as shown in FIG. 7, which light travels through the interconnect to degrade the portion of the photosensitive material covering the interconnect on the opposite side, to yield a masked substrate with exposed interconnects as shown in FIG. 8. While this embodiment requires additional processing steps, it is particularly useful in instances where the interconnects have been previously formed while allowing the workpiece to retain the advantage of an integral temporary mask that is perfectly aligned over the openings of the interconnects.

Once the masks and interconnects are in place, filler material is forced into the interconnects. In one preferred embodiment, this is accomplished as in FIG. 9 by moving a squeegee 30 across the temporary mask on the top of the workpiece with filler material 32 applied previously or simultaneously. In one embodiment, a stenciling or screen-printing machine is used. One such machine is available under designation Ultraprint line of printers from Cookson Electronic Equipment Group, formerly Speedline Technologies division of Cookson Electronics, Inc. of Foxborough, Mass. While these machines are distributed for use with filling processes employing a permanent mask, stencil, or screen, they are modified to eliminate this feature when used to perform this invention. These machines incorporate a pump head (not shown) to provide force in addition to the squeegee force for charging the filler material into the interconnects. Because the integral temporary mask holes are exactly aligned with the interconnects, complex alignment is not required as it would be in other processes using these machines with permanent masks, stencils, or screens.

In selecting a squeegee material for the process, the planarity of the substrate surface is taken into account. Where the substrate surface is not exactly planar, a softer squeegee is employed so that the squeegee edge conforms to non-planarities. A harder squeegee is used where the substrate surface is planar. The use of the liquid coating embodiment of the invention yields a more planar surface, and thus leads to selection of a harder squeegee. In one embodiment of the invention where a liquid coating is used as the temporary mask, a hard squeegee may be used because the liquid coating yields a nearly planar surface.

Figure 9:
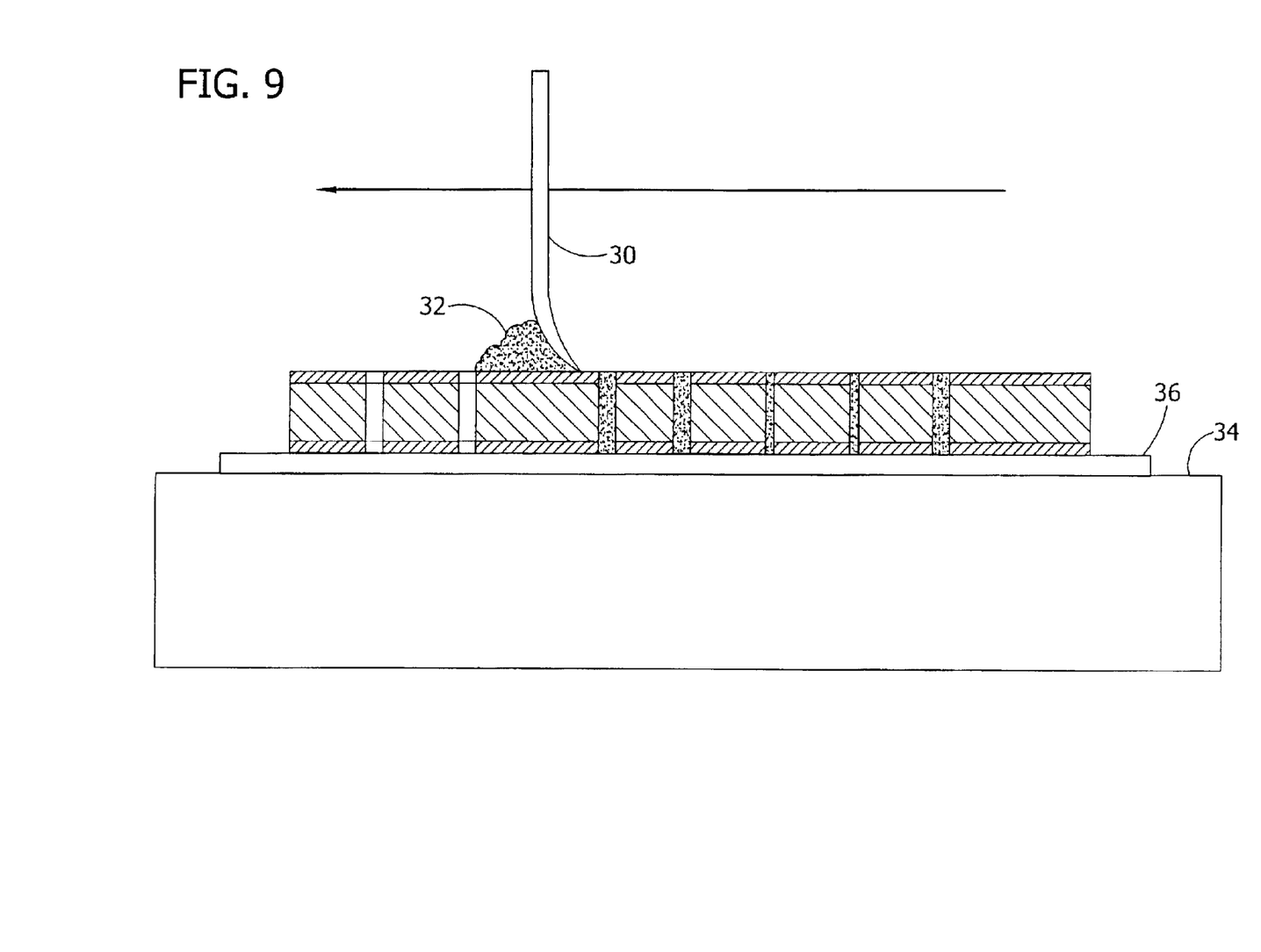
FIG. 9 schematically shows filling of interconnects in an electronic component substrate presented in cross section.

In addition to the squeegee and pump head force applied to insert the filler material into the interconnects, a vacuum bed 34 may be used ensure complete filling and to minimize the presence of trapped air within the filled interconnects. The vacuum bed 34 acts in conjunction with the squeegee by pulling the filler paste through the interconnect. To evenly distribute the vacuum to the bottom of the workpiece and to prevent filler paste from entering the vacuum system, a thin sheet of porous or semi-porous material 36 such as, for example, fabric, paper, porous non-woven sheets, or porous teflon is interposed between the workpiece and the vacuum source 34, as shown in FIG. 9. If a vacuum bed is utilized, the filling process becomes self-limiting because, as the filler paste reaches the bottom of the microvia and comes in contact with the semi-porous material, the blocked pores will initiate an automatic shut-off action in the vacuum bed. By using both a pump head and a vacuum bed to facilitate the impregnation of the interconnects, the invention advantageously reduces or eliminates the presence of trapped air pockets within the interconnects.

Figure 10:
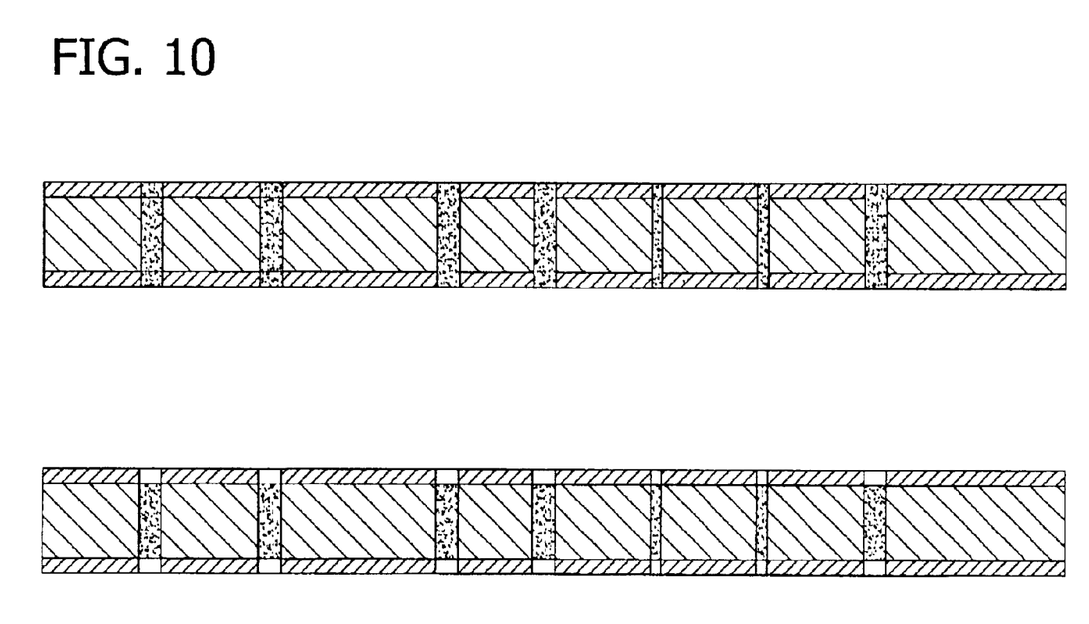
FIG. 10 schematically shows shrinkage phenomenon during curing of filler material in an electronic component substrate presented in cross section.

After the interconnects are impregnated with the filler material, the filler material is cured using heat or microwaves. The curing parameters are dictated by the specific filler material used. In one preferred embodiment where the filler material is silver-filled epoxy conductive adhesive, the workpiece is cured for a period of time between 1 to 60 minutes, and more typically between 5 to 10 minutes, in an oven at a temperature of between about 120° C. and about 180° C. If a microwave cure is used, the period of time may be less than 5 minutes, and more typically between 0.5 and 2.0 minutes. The filler material shrinks during this process, but the excess material on the top and bottom of the interconnect, which is equivalent to the thickness of the temporary masks, will compensate for the shrinkage phenomenon in the manner illustrated in FIG. 10.

Figure 11:
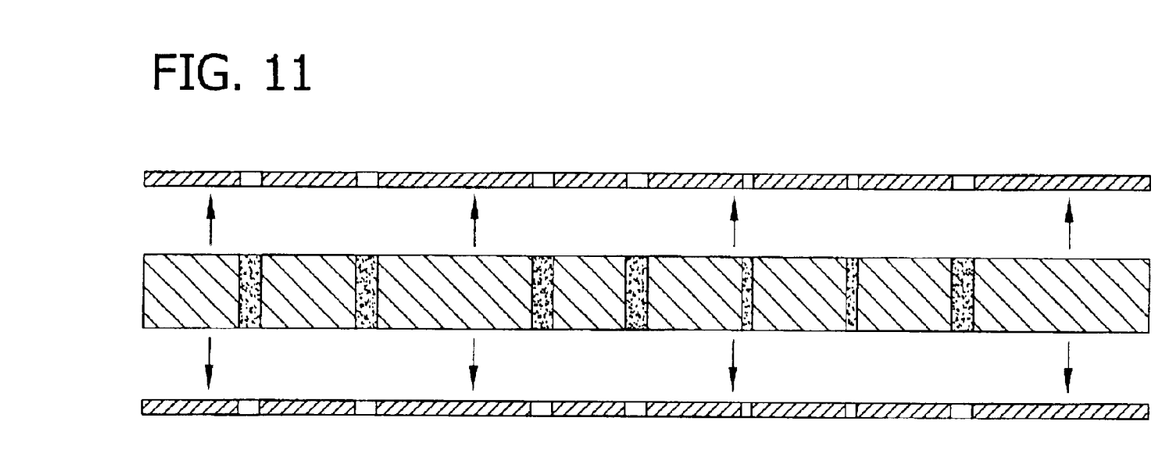
FIG. 11 schematically shows removal of temporary masks to yield filled interconnects in an electronic component substrate presented in cross section.

In the preferred embodiment, the temporary masks are removed after the curing process is complete, as illustrated in FIG. 11. In one preferred embodiment the temporary mask is preferably an aqueous material such as Enplate PNI 1000W (Enthone Electronic Materials, a division of Cookson) Electronics of Foxborough, Mass.), and removal is accomplished by contact with a solution having a moderately higher pH such as, for example, 8.0 or higher to delaminate or otherwise loose adhesion so as to allow mask residue to be removed by filtering the temporary mask.

In another embodiment, the temporary masks are removed prior to the curing process, but the workpiece must be handled from the edges and there must be care taken that the filler material does not shift during any handling prior to the curing process.

In another embodiment, the curing process may be purposefully truncated and the temporary masks removed, leaving nubs of excess filler material over the interconnects. In either of the embodiments where the temporary masks are removed prior to complete curing, the workpiece is typically B-staged, i.e. mated with additional workpieces in a similar state to form a newly stacked workpiece. This new stack is then fully cured to produce the finished electronic component package. Multi-staging is particularly useful when creating electronic component packages with blind interconnects.

If the electronic component package is of sufficient mechanical integrity to withstand typical environmental stresses, as in the case of a printed circuit board, the processing is complete after the curing stage. However, if additional protective packaging is required, as in the case of individual ICs, an encapsulation stage follows the curing process and completes the electronic component package processing.

The foregoing process is employed in one aspect where all or at least a portion of the interconnects are electrical interconnects for transmitting current from one surface of the substrate through the substrate to the other surface of the substrate. In this aspect the filler material is, for example, silver, anti-oxidizing treated copper, silver-plated copper, and other conductors that retain electrical conductivity at the surface. Exemplary filler materials include fully formulated conductive pastes such as available under the trade designation POLYSOLDER from Cookson Electronics Assembly Materials of Alpharetta, Ga. (also, products 119-13 and 120-03 from Creative Materials, Inc., Tyngsboro, Mass., ; E-3082, H20E and H20E-PFC from Epoxy Technology Inc., Billerica, Mass.).

The foregoing process is also employed in another aspect where all or at least a portion of the interconnects are used as thermal pathways or so-called "heat pipes" to conduct heat away from one surface of the substrate toward another surface. The manner of forming and filling the interconnects is the same with both aspects, with the only difference being in the selection of the paste or other fill material. In this aspect where interconnects are thermal pathways, the filler material is, for example, aluminum nitride, boron nitride, beryllium oxide, and other mineral powders. Exemplary fully formulated materials include material available under the trade designation T7109 from Epoxy Technology Product: Output 315 Loctite and Hysol 1-C from Loctite Corporation, of Rocky Hill, Conn.

EXAMPLE 1

A printed circuit board is formed by coating a layer of glass-reinforced resin about 8 mils thick with thin sheets of copper about 1.4 mils thick. The copper is then selectively etched by alkaline etch or cuprous chloride solution to produce the desired circuit design. A polymer film of polyvinyl cinnamate about 1 mil thick is then applied to both the top and the bottom surfaces of the printed circuit board workpiece by screen printing to leave temporary masks thereon. Interconnects are formed through the thickness of the temporary masks and the printed circuit board using a laser drilling process. The workpiece is then placed on a semi-porous piece of fabric, which rests on a vacuum bed. A squeegee blade passes over the top of the substrate, forcing conductive filler paste Epo-tek H20E into the interconnects with the assistance of the pulling force created by the vacuum bed. When the interconnects are fully impregnated, the vacuum system is automatically shut off as a result of the clogged pores in the fabric. The printed circuit board workpiece is then cured by batch type (box) oven at 150° C. for 10 minutes in an air atmosphere. The temporary masks are removed after the curing process by exposing to alkaline aqueous solution such as sodium carbonate, yielding a printed circuit board with interconnects that are filled with cured conductive paste that is coplanar with the copper traces on the surface of the printed circuit board.

EXAMPLE 2

An IC is formed by starting with a silicon substrate and a layer of silicon dioxide on the surface. After numerous stages of photolithography and selective etching, additional conductive materials are applied to form conductive trenches on the surface of the IC workpiece. A liquid coating available from Enthone Electronic Materials, a division of Cookson Electronics of Foxborough, Mass. under the trade designation ENPLATE UR-578B UV-Curable Plate and Etch Resist, Alkaline Strippable, about 10 microns thick is then applied to both the top and the bottom surfaces of the IC workpiece by spin-coating. Interconnects are formed through the thickness of the temporary masks and the IC using a laser drilling process. A squeegee blade then passes over the top of the interconnects, forcing conductive filler paste POLYSOLDER, Cookson Electronics Assembly Materials (Alpharetta, Ga.) into the interconnects. The IC workpiece is then cured by a Batch process for 5 minutes at 150° C. The temporary masks are removed after the curing process by immersion in alkaline mask stripper, yielding an IC with interconnects that are filled with cured conductive paste that is coplanar with the conductive trenches on the surface of the IC. A final encapsulation stage involving coating with parylene or liquid epoxy encapsulant is employed to reinforce the integrity of the IC and provide connections from the chips to the products for which they have been manufactured.

When introducing elements of the present invention or the preferred embodiment(s) thereof, the articles "a", "an", "the" and "said" are intended to mean that there are one or more of the elements. The terms "comprising", "including" and "having" are intended to be inclusive and mean that there may be additional elements other than the listed elements.

The foregoing relates to a limited number of embodiments that have been provided for illustration purposes only. It is intended that the scope of invention is defined by the appended claims and there are modifications of the above embodiments that do not depart from the scope of the invention.

What is claimed is:

1. A process for masking an electronic component substrate having an upper surface and a lower surface from contact with filler paste material employed in an interconnect filling procedure, the process comprising:

applying a temporary mask material to at least one of said upper and lower surfaces to form a removably adhered temporary mask over the surface to which the temporary mask material is applied to mask said surface from said contact with said filler paste material, wherein the temporary mask material is selected from among polymer films and aqueous hardenable liquid coatings.

2. The process of claim 1 wherein the temporary mask material is a polymer film with a pressure-sensitive adhesive on at least one side of the polymer film.

3. The process of claim 1 wherein the temporary mask material is selected from the group consisting of polyethylene, polypropylene, and polyester.

4. The process of claim 1 wherein the temporary mask material comprises plasticized polyvinyl chloride.

5. The process of claim 1 wherein the temporary mask material is an aqueous hardenable liquid coating selected from the group of coatings consisting of an aqueous photoimagable carboxylated polyacrylic coating and a polymethacylic removable coating.

6. The process of claim 1 wherein the temporary mask material is an aqueous hardenable liquid coating and applying the temporary mask is accomplished by a method selected from the group of methods comprising immersion, spin coating, screen printing, and roller coating.

7. The process of claim 1 wherein the temporary mask material is an aqueous hardenable liquid coating and applying the temporary mask is accomplished by vapor deposition.

8. The process of claim 1 wherein:

the temporary mask material is photo-degradable and the substrate comprises a through-hole interconnect extending from the upper surface to the lower surface;

applying the temporary mask material to at least one of said upper and lower surfaces comprises applying the temporary mask material to only one of said upper and lower surfaces;

the interconnect has an opening at the surface to which the temporary mask is applied; and the process further comprises forming a hole in the temporary mask at the opening of the interconnect by exposing the temporary mask to light traveling through the interconnect from a side opposite the surface to which the temporary mask is applied.

9. The process of claim 1 wherein the electronic component substrate is an IC semiconductor substrate.

10. The process of claim 1 wherein the electronic component substrate is a printed circuit board substrate.

11. A process for filling an interconnect between an upper surface and a lower surface of an electronic component substrate, the process comprising:

applying a temporary mask material to at least one of said upper and lower surfaces to form a removably adhered temporary mask over the surface to which the temporary mask material is applied for masking the surface from contact with a filler paste material;

forming a hole in the temporary mask at an opening of the interconnect to the substrate surface; and filling the interconnect with said filler paste material by forcing the filler material through the hole in the temporary mask into the interconnect.

12. The process of claim 11 wherein the temporary mask material is selected from among polymer films and aqueous hardenable liquid coatings.

13. The process of claim 11 wherein the temporary mask material is photo-degradable and forming the hole in the temporary mask comprises exposing the temporary mask to light at the opening to degrade the temporary mask at the opening.

14. The process of claim 11 wherein the temporary mask material is photo-degradable and said forming the hole in the temporary mask comprises the following, in sequence;

applying the temporary mask material to a first surface selected from the upper and lower surfaces;

exposing the temporary mask to light traveling through the interconnect from a side opposite the first surface to thereby degrade the temporary mask at an opening of the interconnect at the first surface;

applying the temporary mask material to a second surface opposite the first surface; and exposing the temporary mask to light traveling through the interconnect from a side opposite the second surface to thereby degrade the temporary mask at an opening of the interconnect at the second surface.

15. The process of claim 11 wherein the temporary mask material is a polymer film with a pressure-sensitive adhesive on at least one side of the polymer film.

16. The process of claim 11 wherein the temporary mask material is selected from the group consisting of polyethylene, polypropylene, and polyester.

17. The process of claim 11 wherein the temporary mask material comprises plasticized polyvinyl chloride.

18. The process of claim 11 wherein the temporary mask material is an aqueous hardenable liquid coating selected from the group of coatings consisting of an aqueous photoimagable carboxylated polyacrylic coating and a polymethacylic removable coating.

19. The process of claim 11 wherein the temporary mask material is an aqueous hardenable liquid coating and applying the temporary mask is accomplished by a method selected from the group of methods comprising immersion, spin coating, screen printing, and roller coating.

20. The process of claim 11 wherein the temporary mask material is an aqueous hardenable liquid coating and applying the temporary mask is accomplished by vapor deposition.

21. The process of claim 11 wherein the electronic component substrate is an IC semiconductor substrate.

22. The process of claim 11 wherein the electronic component substrate is a printed circuit board substrate.

23. A process for forming and filling an interconnect between an upper surface and a lower surface of an electronic component substrate, the process comprising:

applying a temporary mask material to at least one of said upper and lower surfaces to form a removably adhered temporary mask over the surface to which the temporary mask material is applied;

forming a continuous through-hole extending through the mask and through the substrate, the continuous through-hole comprising a hole in the temporary mask and the interconnect through the substrate; and filling the interconnect with a filler material by forcing the filler material through the hole in the temporary mask and into the interconnect.

24. The process of claim 23 wherein the temporary mask material is selected from among polymer films and aqueous hardenable liquid coatings.

25. The process of claim 23 wherein the temporary mask material is a polymer film with a pressure-sensitive adhesive on at least one side of the polymer film.

26. The process of claim 23 wherein the temporary mask material is selected from the group consisting of polyethylene, polypropylene, and polyester.

27. The process of claim 23 wherein the temporary mask material comprises plasticized polyvinyl chloride.

28. The process of claim 23 wherein the temporary mask material is an aqueous hardenable liquid coating selected from the group of coatings consisting of an aqueous photoimagable carboxylated polyacrylic coating and a polymethacylic removable coating.

29. The process of claim 23 wherein the temporary mask material is an aqueous hardenable liquid coating and applying the temporary mask is accomplished by a method selected from the group of methods comprising immersion, spin coating, screen printing, and roller coating.

30. The process of claim 23 wherein the temporary mask material is an aqueous hardenable liquid coating and applying the temporary mask is accomplished by vapor deposition.

31. The process of claim 23 wherein the filler material imparts electrical conductivity to the interconnect.

32. The process of claim 23 wherein the filler material imparts thermal conductivity to the interconnect so the interconnect functions to transmit heat away from one side of the substrate to an opposite side thereof.

33. The process of claim 23 wherein the electronic component substrate is an IC semiconductor substrate.

34. The process of claim 23 wherein the electronic component substrate is a printed circuit board substrate.

35. A process for filling an interconnect between an upper surface and a lower surface of an electronic component substrate, the process comprising:
applying a temporary mask material to each of said upper and lower surfaces to form a removably adhered temporary mask;
forming a continuous through-hole extending through the mask and through the substrate, the continuous through-hole comprising a hole in the temporary mask and a hole through the substrate constituting the interconnect; and
filling the interconnect with a filler material by forcing the filler material through the hole in the temporary mask and into the interconnect hole.

36. The process of claim 35 comprising removing the temporary mask after filling the interconnect.

37. The process of claim 35 wherein the temporary mask material is a polymer film with a pressure-sensitive adhesive on at least one side of the polymer film.

38. The process of claim 35 wherein the temporary mask material is selected from the group consisting of polyethylene, polypropylene, and polyester.

39. The process of claim 35 wherein the temporary mask material comprises plasticized polyvinyl chloride.

40. The process of claim 35 wherein the temporary mask material is an aqueous hardenable liquid coating selected from the group of coatings consisting of an aqueous photoimagable carboxylated polyacrylic coating and a polymethacylic removable coating.

41. The process of claim 35 wherein the temporary mask material is an aqueous hardenable liquid coating and applying the temporary mask is accomplished by a method selected from the group of methods comprising immersion, spin coating, screen printing, and roller coating.

42. The process of claim 35 wherein the temporary mask material is an aqueous hardenable liquid coating and applying the temporary mask is accomplished by vapor deposition.

43. The process of claim 35 wherein the electronic component substrate is an IC semiconductor substrate.

44. The process of claim 35 wherein the electronic component substrate is a printed circuit board substrate.

45. An electronic component substrate comprising:
an upper substrate surface and a lower substrate surface,
a temporary mask for masking at least one of said upper substrate surface and said lower substrate surface from contact with interconnect filler paste material, the temporary mask being removably adhered to at least one of said upper substrate surface and said lower substrate surface, wherein the temporary mask comprises temporary mask material selected from among polymer films and aqueous hardenable liquid coatings.

46. The electronic component substrate of claim 45 wherein the electronic component substrate is an IC semiconductor substrate.

47. The electronic component substrate of claim 45 wherein the electronic component substrate is a printed circuit board substrate.

48. The electronic component substrate of claim 45 wherein the temporary mask material is a polymer film with a pressure-sensitive adhesive on at least one side of the polymer film.

49. The electronic component substrate of claim 45 wherein the temporary mask material is selected from the group consisting of polyethylene, polypropylene, and polyester.

50. The electronic component substrate of claim 45 wherein the temporary mask material comprises plasticized polyvinyl chloride.

51. The electronic component substrate of claim 45 wherein the temporary mask material is an aqueous hardenable liquid coating selected from the group of coatings consisting of an aqueous photoimagable carboxylated polyacrylic coating and a polymethacylic removable coating.

52. The electronic component substrate of claim 45 wherein the temporary mask material is an aqueous hardenable liquid coating removably bonded to the substrate by a method selected from the group of methods comprising immersion, spin coating, screen printing, and roller coating.

53. The electronic component substrate of claim 45 wherein the temporary mask material is an aqueous hardenable liquid coating removably bonded to the substrate by vapor deposition.

54. The electronic component substrate of claim 45 wherein the substrate comprises an interconnect hole therethrough formed co-axially and simultaneously with a hole in the temporary mask.

55. The electronic component substrate of claim 45 wherein the temporary mask is removably adhered to both the upper surface and lower surface of the substrate.

56. An electronic component substrate comprising:
an upper substrate surface and a lower substrate surface;
a temporary mask comprising a temporary mask material removably adhered to at least one of said upper substrate surface and said lower substrate surface; and
an interconnect hole through the substrate formed co-axially and contemporaneously with a hole in the temporary mask.

57. The electronic component substrate of claim 56 wherein the temporary mask material is selected from among polymer films and aqueous hardenable liquid coatings.

58. The electronic component substrate of claim 56 wherein the electronic component substrate is an IC semiconductor substrate.

59. The electronic component substrate of claim 56 wherein the electronic component substrate is a printed circuit board substrate.

60. The electronic component substrate of claim 56 wherein the temporary mask material is a polymer film with a pressure-sensitive adhesive on at least one side of the polymer film.

61. The electronic component substrate of claim 56 wherein the temporary mask material is selected from the group consisting of polyethylene, polypropylene, and polyester.

62. The electronic component substrate of claim 56 wherein the temporary mask material comprises plasticized polyvinyl chloride.

63. The electronic component substrate of claim 56 wherein the temporary mask material is an aqueous hardenable liquid coating selected from the group of coatings consisting of an aqueous photoimagable carboxylated polyacrylic coating and a polymethacylic removable coating.

64. The electronic component substrate of claim 56 wherein the temporary mask material is an aqueous hardenable liquid coating removably bonded to the substrate by a method selected from the group of methods comprising immersion, spin coating, screen printing, and roller coating.

65. The electronic component substrate of claim 56 wherein the temporary mask material is an aqueous hardenable liquid coating removably bonded to the substrate by vapor deposition.

66. The electronic component substrate of claim 56 wherein the substrate comprises an interconnect hole therethrough formed co-axially and simultaneously with a hole in the temporary mask.

67. The electronic component substrate of claim 56 wherein the temporary mask is removably adhered to both the upper surface and lower surface of the substrate.

* * * * *